(12) United States Patent
Choi et al.

(10) Patent No.: US 9,343,601 B2
(45) Date of Patent: May 17, 2016

(54) PHOTODETECTOR

(71) Applicant: UNIVERSITY-INDUSTRY COOPERATION GROUP OF KYUNG HEE UNIVERSITY, Yongin-si, Gyeonggi-do (KR)

(72) Inventors: Suk Ho Choi, Suwon-si (KR); Sung Kim, Suwon-si (KR); Chang Oh Kim, Seoul (KR)

(73) Assignee: UNIVERSITY-INDUSTRY COOPERATION GROUP OF KYUNG HEE UNIVERSITY, Yongin-si (KR)

( * ) Notice: Subject to any disclaimer, the term of this patent is extended or adjusted under 35 U.S.C. 154(b) by 0 days.

(21) Appl. No.: 14/758,593

(22) PCT Filed: Jun. 27, 2013

(86) PCT No.: PCT/KR2013/005702
§ 371 (c)(1),
(2) Date: Jun. 30, 2015

(87) PCT Pub. No.: WO2014/109444
PCT Pub. Date: Jul. 17, 2014

(65) Prior Publication Data
US 2015/0357485 A1 Dec. 10, 2015

(30) Foreign Application Priority Data
Jan. 11, 2013 (KR) ........................ 10-2013-0003539

(51) Int. Cl.
*H01L 31/028* (2006.01)
*H01L 31/0392* (2006.01)
*H01L 31/0745* (2012.01)

(52) U.S. Cl.
CPC ........ *H01L 31/028* (2013.01); *H01L 31/03921* (2013.01); *H01L 31/0745* (2013.01); *Y02E 10/547* (2013.01)

(58) Field of Classification Search
CPC ... H01L 21/041; H01L 21/043; H01L 21/324; H01L 29/861; H01L 29/1606; H01L 29/6603; H01L 29/66136; H01L 31/028; H01L 31/0392; H01L 31/03921
See application file for complete search history.

(56) References Cited

U.S. PATENT DOCUMENTS

| 2011/0042650 A1 | 2/2011 | Avouris et al. |
| 2011/0153119 A1 | 6/2011 | Lee et al. |

(Continued)

FOREIGN PATENT DOCUMENTS

| KR | 10-2011-0020443 A | 3/2011 |
| KR | 10-2012-0086177 A | 8/2012 |

OTHER PUBLICATIONS

Xiaodong Xu, et al., "Photo-Thermoelectric Effect at a Graphene Interface Junction", Nano Letters, 2010, pp. 562-566, vol. 10.

(Continued)

*Primary Examiner* — Tan N Tran
*Assistant Examiner* — Fazli Erdem
(74) *Attorney, Agent, or Firm* — Sughrue Mion, PLLC

(57) ABSTRACT

Provided is a photodetector including a graphene p-n homogeneous vertical-junction diode by evaluating photodetection characteristics of the manufactured graphene p-n vertical junction according to the amount of doping. The photodetector comprises a substrate and graphene having a p-n homogeneous vertical junction as a photodetection layer formed on the substrate, wherein the photodetection layer has a detectability of 10E11 (Jones) or higher within the range of 350 nm to 1100 nm, and first and second electrodes are formed on the photodetection layer.

8 Claims, 16 Drawing Sheets

(56) References Cited

U.S. PATENT DOCUMENTS

| | | |
|---|---|---|
| 2011/0193610 A1 | 8/2011 | Longhurst |
| 2012/0153119 A1 | 6/2012 | Patil et al. |
| 2012/0193610 A1 | 8/2012 | Kim |
| 2015/0014630 A1* | 1/2015 | Choi .................. H01L 29/1606 257/24 |
| 2015/0171167 A1* | 6/2015 | Nourbakhsh ....... H01L 29/1606 257/29 |
| 2015/0206940 A1* | 7/2015 | Choi ..................... H01L 29/861 257/29 |

OTHER PUBLICATIONS

International Search Report for PCT/KR2013/005702 dated Sep. 30, 2013 [PCT/ISA/210].

KIPO Office Action for Application No. 10-2013-0003539 dated Mar. 31, 2014.

* cited by examiner

PHOTODETECTOR

CROSS REFERENCE TO RELATED APPLICATIONS

This application is a National Stage of International Application No. PCT/KR2013/005702, filed on Jun. 27, 2013, which claims priority from Korean Patent Application No. 10-2013-0003539, filed on Jan. 11, 2013, the contents of all of which are incorporated herein by reference in their entirety.

TECHNICAL FIELD

The present invention relates to a photodetector, and more particularly, to a photodetector using a photodetection layer provided through vertical tunneling-junctions of p-type graphene and n-type graphene.

RELATED ART

Currently, research on a photodetector that absorbs optical energy and converts it to electrical energy is actively conducted. Si, Ge, and InGaAs photodetectors, which are already commercialized, are being widely used to detect light in the ultraviolet (UV), visible, and infrared (IR) ranges, respectively. However, the Si and Ge photodetectors can be used in a limited photo-detection band even though they operate at room temperature. The InGaAs photodetector may exhibit high-sensitive performance only when it is cooled down to 4.2 K. In addition, maximized portability, transparency, and flexibility are required as principle characteristics for a next generation photodetector. To this end, the device fabrication processes should be suitable for a transparent and flexible substrate. However, this substrate is vulnerable to the heat, which makes it very difficult to fabricate a flexible device using materials, such as Si, Ge, and InGaAs, that grow at high temperature. Although the fabrication is possible, the commercialization still has many constraints due to a complex fabrication process and large expenses. Accordingly, there is a need to discover materials and/or structures well matched to a photodetector available on flexible or transparent substrates by simple and inexpensive processes and also capable of detecting light with high sensitivity and high efficiency in a relatively wide range.

Geim and Novoselov won the Nobel Prize in physics in 2010 for their work on graphene, an allotrope of carbon in the form of two-dimensional, atomic-scale, hexagonal honeycomb lattice. Due to novel characteristics such as relatively high carrier mobility, high transparency, and an electrical property not changed even after being extended or bent, considerable studies on graphene are ongoing and graphene is called as an ideal nano material. In particular, due to the zero-band-gap nature of graphene, electron-hole pairs may be generated in graphene by illumination in a relatively wide range of UV to IR. In this regard, graphene is a material considered to be used as one of the most promising photo-electron materials for the next generation. Research on the photodetector based on graphene has been reported so far.

However, graphene photodetectors reported so far have been fabricated based on graphene p-n lateral junctions formed around a gate by adjusting the charge type and concentration with a gate voltage, a complex structure of graphene with a material, such as PbS or CdSe that proved to be efficiently photo-detective, or graphene-metal junctions. However, the above method may degrade photodetection capability or may induce many difficulties for real device applications in terms of a structure. Therefore, it is very important to develop a high-performance device that can be easily realized at low expenditures by using excellent characteristics of graphene.

DESCRIPTION OF INVENTION

Subjects

Due to the Klein tunneling effect, junctions of p-type graphene and n-type graphene do not show typical diode rectifying characteristics whereby a high dark current flows. Thus, it was difficult to apply the graphene p-n junctions to a high efficient photodetector field. Accordingly, the dark current is to be decreased and the photocurrent is to be increased in order to develop a high efficient graphene photodetector. Also, when graphene or n-type graphene is exposed in the air, its electrical characteristics are converted to a p-type. Thus, this issue is also to be overcome.

The present invention provides a photodetector containing graphene vertical tunneling-junction diodes by assessing photodetection characteristics of graphene p-n vertical junctions formed depending on doping concentration.

Subjects to be achieved by the present invention are not limited to the aforementioned subjects and other subjects not described herein may be clearly understood by those ordinary skills in the art from the following description.

Solutions

According to an aspect of the present invention, there is provided a photodetector including a substrate; a photodetection layer formed on the substrate and including a vertical tunneling-junction of p-type graphene and n-type graphene and having a detectivity of 10E11 (Jones) or more within the range of 350 nm to 1100 nm; and a first electrode and a second electrode formed on the photodetection layer.

The photodetector may include first graphene and second graphene that are sequentially stacked on the substrate, and the first graphene may be n-type graphene, and the second graphene may be p-type graphene.

Each of the first graphene and the second graphene may be monolayer graphene.

The first graphene and the second graphene may be formed through contact therebetween.

The first graphene may include a high resistive layer formed at the interface between the first graphene and the second graphene.

The photodetection layer may further include an inserting layer formed between the first graphene and the second graphene.

The inserting layer may include one of a semiconductor layer and an insulating layer.

The photodetection layer may have the detectivity of 10E11 (Jones) or more within the range of 350 nm to 1100 nm when a voltage applied to the first electrode and the second electrode is between 2 V to 5 V.

Other detailed matters of the present invention are included in the detailed description and drawings.

Effects of Invention

According to embodiments of the present invention, it is possible to fabricate a photodetector containing graphene p-n vertical junctions using doped graphene. Also, it is possible to provide a fundamental base capable of applying graphene to the photodetector by assessing structural, optical, and electrical characteristics as a function of doping concentration in the photodetector containing formed graphene p-n junctions. Further, it is possible to fabricate the high efficient photodetector by inserting various semiconductor layers or insulating layers between graphene p-n vertical junctions.

DETAILED DESCRIPTION TO CARRY OUT THE INVENTION

Figure 1:
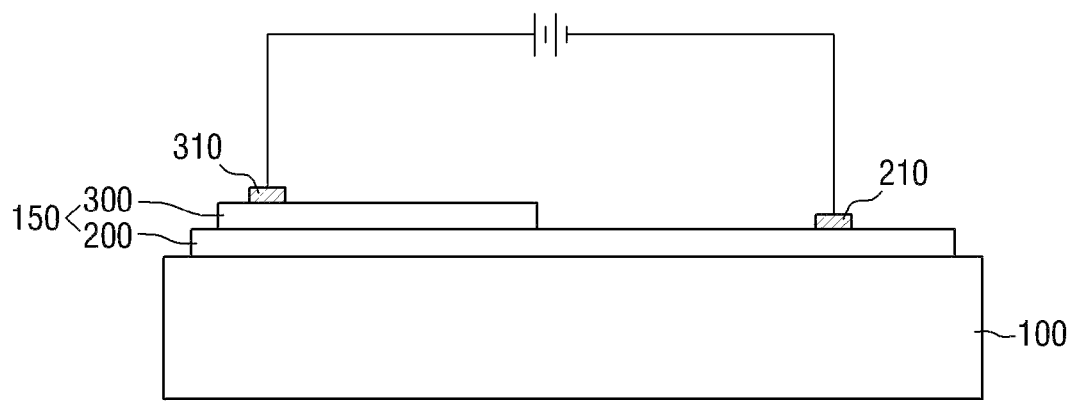
FIG. 1 is a cross-sectional view of a photodetector according to an embodiment of the present invention.

Advantages and features of the invention and methods to achieve the same are described more fully hereinafter with reference to the accompanying drawings in which embodiments are shown. This invention may, however, be embodied in many different forms and should not be construed as limited to the embodiments set forth herein. Rather, these embodiments are provided so that this disclosure is thorough, and will fully convey the scope of the invention to those skilled in the art and this invention is defined by the scope of the claims. Like reference numerals refer to like elements throughout the present specification.

It will be understood that, although the terms "first", "second", etc. may be used herein to describe various elements, constituent elements and/or sections, the elements, constituent elements and/or sections should not be limited by these terms. These terms are only used to distinguish one element, constituent element, or section from another element, constituent element, or section. Thus, a first element, a first constituent element, or a first section discussed below should be termed a second element, a second constituent element, or a second section.

It will be understood that when an element or a layer is referred to as being "on" or "above" another element or layer, it can be directly on or above the other element or layer or intervening elements or layers may be present. In contrast, when an element is referred to as being "directly on" or "directly above", there are no intervening elements or layers.

Spatially relative terms, such as "below", "beneath", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented and the spatially relative descriptors used herein interpreted accordingly.

The terminology used herein is for the purpose of describing particular embodiments only and is not intended to be limiting of embodiments. As used herein, the singular forms "a", "an", and "the" are intended to include the plural forms as well, unless the context clearly indicates otherwise. It will be further understood that the terms "comprises" and/or "comprising", when used in this specification, specify the presence of stated features, steps, operations and/or components do not preclude the presence or addition of one or more features, steps, operations and/or components.

Unless otherwise defined, all terms (including technical and scientific terms) used herein have the same meaning as commonly understood by one of ordinary skill in the art to which the invention belongs. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Hereinafter, a photodetector according to an embodiment of the present invention will be described with reference to FIG. 1.

FIG. 1 is a cross-section view of a photodetector according to an embodiment of the present invention.

Referring to FIG. 1, a photodetector 1 includes a substrate 100, a photodetection layer 150, a first electrode 210, and a second electrode 310.

The substrate 100 may be, for example, a rigid substrate, such as a silicon substrate, a silicon on insulator (SOI) substrate, a gallium arsenic substrate, a silicon germanium substrate, a ceramic substrate, a quartz substrate, or a glass substrate for display, and a flexible plastic substrate, such as polyimide, polyethylene terephthalate (PET), polyethylene naphthalate (PEN), poly methyl methacrylate (PMMA), polycarbonate (PC), poly ether sulfone (PES), and polyester. Also, the substrate 100 may be a transparent substrate capable of transmitting light.

The photodetection layer 150 is formed on the substrate 100. The photodetection layer 150 may include first graphene 200 and second graphene 300. In detail, a width of the photodetection layer 150 may be substantially equal to a width of an overlapping area between the first graphene 200 and the second graphene 300, that is, a width of an area on which the second graphene 300 is formed. The first graphene 200 and the second graphene 300 included in the photodetection layer 150 may be vertical tunneling-junction p-n diodes. The photodetection layer 150 may have the detectivity of 10E11 Jones (cmHz$^{1/2}$/W) or more within the range of, for example, 350 nm to 1100 nm. The detectivity of the photodetection layer 150 will be described in detail with reference to experimental results.

The photodetection layer 150 includes the first graphene 200 and the second graphene 300 that are sequentially stacked on the substrate 100. The first graphene 200 and the second graphene 300 may have a first conductivity type and a second conductivity type, respectively. The first conductivity type and the second conductivity type differ from each other. The photodetector according to embodiments of the present invention is described based on an example in which the first graphene 200 is n-type graphene and the second graphene 300 is p-type graphene, however, is not limited thereto. That is, the first graphene 200 may be p-type graphene and the second graphene 300 may be n-type graphene.

Due to the following reasons, a conductivity type of the first graphene 200 is described as an n-type in the photodetector according to embodiments of the present invention. N-type graphene or pristine graphene in which impurities are not doped becomes p type in the air due to the adsorption of oxygen in the air. Thus, when the conductivity type of the second graphene 300 is provided in an n-type, the second graphene 300 is exposed in the air and thus, may be converted from the n-type to a p-type over time. Due to the above phenomenon, the n-type concentration of the second graphene 300 around a boundary with the p-type first graphene 200 may vary. When the concentration varies in a junction portion of p-n diodes, the reliable results of p-n vertical junction diodes cannot be obtained. Accordingly, the embodiments of the present invention are described based on an example in which the conductivity type of the first graphene 200 is provided in the n-type.

Each of the first graphene 200 and the second graphene 300 may be provided in a shape of, for example, a two-dimensional (2D) sheet including a single layer, however, is not limited thereto.

The first graphene 200 and the second graphene 300 vertically joined for the photodetection layer 150 may be formed through mutual direct contact, however, are not limited thereto. That is, an inserting layer may be formed between the first graphene 200 and the second graphene 300, which will be described with reference to FIG. 2.

The first graphene 200 may include a high resistive layer or an insulating layer at the interface 250 in contact with the second graphene 300. The high resistive layer formed on the first graphene 200 may be a layer that is formed by adjusting a doping concentration of the first graphene 200, instead of inserting another material between the first graphene 200 and the second graphene 300. The high resistive layer formed on the first graphene 200 will be further described below based on experimental results.

The first electrode 210 and the second electrode 310 are formed on the photodetection layer 150. That is, the first electrode 210 and the second electrode 310 are formed on the first graphene 200 and the second graphene 300, respectively, which are p-n vertical tunneling-junctions. In the photodetector according to an embodiment of the present invention, the first electrode 210 is formed on the n-type first graphene 200 and the second electrode 310 is formed on the p-type second graphene 300. The first electrode 210 and the second electrode 310 may include a material forming an ohmic contact with graphene, and may include, for example, silver (Ag). Each of the first electrode 210 and the second electrode 310 may include a single layer, however, is not limited thereto. Each of the first electrode 210 and the second electrode 310 may further include an inserting layer (not shown) capable of reducing contact resistance with graphene.

Although FIG. 1 illustrates that the first electrode 210 and the second electrode 310 are formed on the same surface of the photodetection layer 150 and are provided in a lateral type, the present invention is not limited thereto. That is, the first electrode 210 and the second electrode 310 may be formed on facing surfaces of the photodetection layer 150 and may be provided in a vertical type. That is, the first electrode 210 may be provided between the substrate 100 and the first graphene 200, and the second electrode 310 may be formed on the second graphene 300.

A photodetector according to another embodiment of the present invention will be described with reference to FIG. 2. The present embodiment is substantially identical to the aforementioned embodiment except that an inserting layer is further included in a photodetection layer. Accordingly, same reference numerals are used to a portion that repeats the aforementioned embodiment and a description related thereto will be briefly made or omitted.

Figure 2:
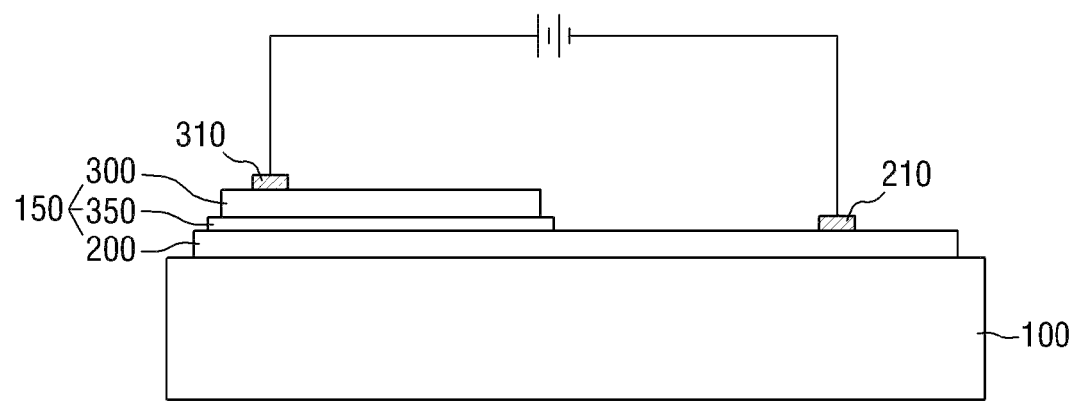
FIG. 2 is a cross-sectional view of a photodetector according to another embodiment of the present invention.

FIG. 2 is a cross-sectional view of a photodetector according to another embodiment of the present invention.

Referring to FIG. 2, a photodetector 2 includes the substrate 100, the photodetection layer 150, the first electrode 210, and the second electrode 310. The photodetection layer 150 includes the first graphene 200 and the second graphene 300, and further includes an inserting layer 350 disposed between the first graphene 200 and the second graphene 300.

Each of the first graphene 200 and the second graphene 300 may be provided in a shape of, for example, a 2D plane including a single layer. Dissimilar to the photodetector according to the embodiment of the present invention, the inserting layer 350 is formed between the first graphene 200 and the second graphene 300. The inserting layer 350 may be formed in contact with each of the first graphene 200 and the second graphene 300. The inserting layer 350 may include one of, for example, a semiconductor layer and an insulating layer. The insulating layer used as the inserting layer 350 may include one of, for example, BN, $MoS_2$, $SiO_2$, $Al_2O_3$, $HfO_2$, $ZrO_2$, and $WS_2$, however, is not limited thereto.

In the photodetector according to the embodiment of the present invention, the first graphene 200 and the second graphene 300 form p-n vertical junction diodes through direct contact therebetween. That is, referring to FIG. 1, the first graphene 200 includes the high resistive layer or the insulating layer at the interface 350 in contact with the second graphene 300.

However, in the photodetector 2 according to another embodiment of the present invention, the first graphene 200 and the second graphene 300 may not include the high resistive layer or the insulating layer at the interface 250 so that the photodetection layer 150 may form p-n vertical junction diodes. That is, in the photodetector according to an embodiment of the present invention, the inserting layer 350 may be provided instead of the high resistive layer or the insulating layer included in the first graphene 200. Accordingly, the first graphene 200, the inserting layer 350, and the second graphene 300, which are sequentially stacked on the substrate 100, may form p-n vertical junction diodes.

Hereinafter, a method of fabricating a photodetector according to an embodiment of the present invention will be described with reference to FIG. 1.

First pristine graphene is formed on the substrate 100 by forming the first pristine graphene in which impurities are not doped and disposing the formed first pristine graphene on the substrate 100. The first pristine graphene formed on the substrate 100 may be, for example, monolayer graphene. A first dopant solution may be dropped on the first pristine. The dropped first dopant solution may be adsorbed to the first pristine graphene. Since a conductivity type of the first graphene 200 is an n-type, the first dopant solution may contain first impurities. For example, the first impurities may be benzyl viologen (BV). A state in which the first pristine graphene is doped with the first dopant solution may be maintained for a predetermined duration of time. For a duration of time in which the first dopant solution is applied, a portion of the first dopant solution may be adsorbed to the first pristine graphene. With increasing a duration of time in which the first dopant solution is applied, an amount of the first dopant solution adsorbed to the first pristine graphene may increase, which may lead to increasing an amount of first impurities adsorbed to the first pristine graphene.

When a predetermined duration of time is elapsed, the first dopant solution adsorbed to the first pristine graphene is uniformly applied over the first pristine graphene. During uniformly applying the first dopant solution over the first pristine, the first dopant solution not adsorbed to the first pristine graphene may be removed. For example, a spin coater may be used to uniformly apply the first dopant solution over the first pristine graphene. When using the spin coater, it is possible to uniformly spread and apply the first dopant solution over the first pristine graphene and to remove the not-adsorbed first dopant solution. The spin coater may spin at, for example, 1000 revolutions per minute (rpm) to 3000 rpm. The spin coater may rotate the first pristine graphene doped with the first dopant solution for, for example, 30 seconds to 2 minutes.

Thermal processing is performed on the first pristine graphene over which the first dopont solution is applied. The thermal processing of the first pristine graphene may employ, for example, a rapid thermal annealing (RTA) method. A thermal processing temperature may be, for example, 100 degrees to 300 degrees, and a thermal processing time may be, for example, 10 minutes to 30 minutes. Through the thermal processing, the n-type first graphene 200 may be formed on the substrate 100.

The p-type second graphene 300 in contact with the first graphene 200 may be formed on the first graphene 200. A portion of the first graphene 200 may be exposed when the second graphene 300 is formed.

Second pristine graphene is disposed on the first graphene 200 of the first conductivity type. The second pristine graphene may be, for example, monolayer graphene. A second dopant solution containing second impurities may be adsorbed to the second pristine graphene. Since a conductivity type of the second graphene 300 is a p-type, the second impurities may be, for example, gold chloride ($AuCl_3$). An amount of the second dopant solution to be adsorbed to the second pristine graphene may be adjusted by maintaining the second pristine graphene to which the second dopant solution is adsorbed for a predetermined duration of time. When a predetermined duration of time is elapsed, the adsorbed second dopant solution may be uniformly applied over the second pristine graphene using, for example, a spin coater. Thermal processing is performed on the second pristine graphene over which the second dopant solution is applied. Accordingly, the photodetection layer 150 on which the p-type second graphene 300 is formed may be formed on the n-type first graphene 200. The spin coater and the thermal processing method are substantially identical to methods used to form the first graphene 200 and thus, a description related thereto is omitted.

The first electrode 210 and the second electrode 310 are formed on the exposed first graphene 200 and second graphene 300, respectively, that is, on the photodetection layer 150.

A method of fabricating a photodetector according to another embodiment of the present invention may further include a process of forming the inserting layer 350 between a process of forming the n-type first graphene 200 and a process of forming the p-type second graphene 300.

Hereinafter, experimental results of a photodetector according to embodiments of the present invention will be described with reference to FIGS. 3 through 18.

Figure 3:
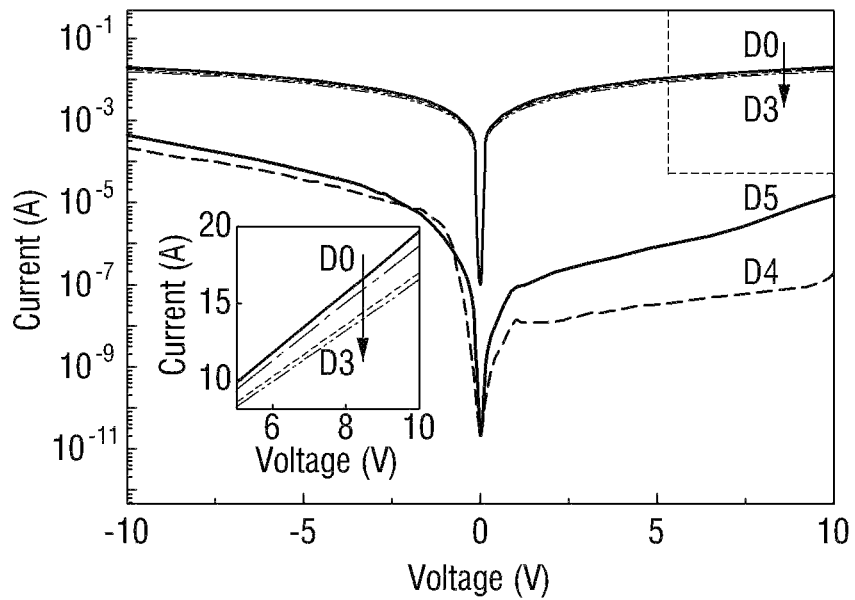
FIG. 3 is a log scale graph showing I-V characteristics of a photodetector according to an embodiment of the present invention.
Figure 4:
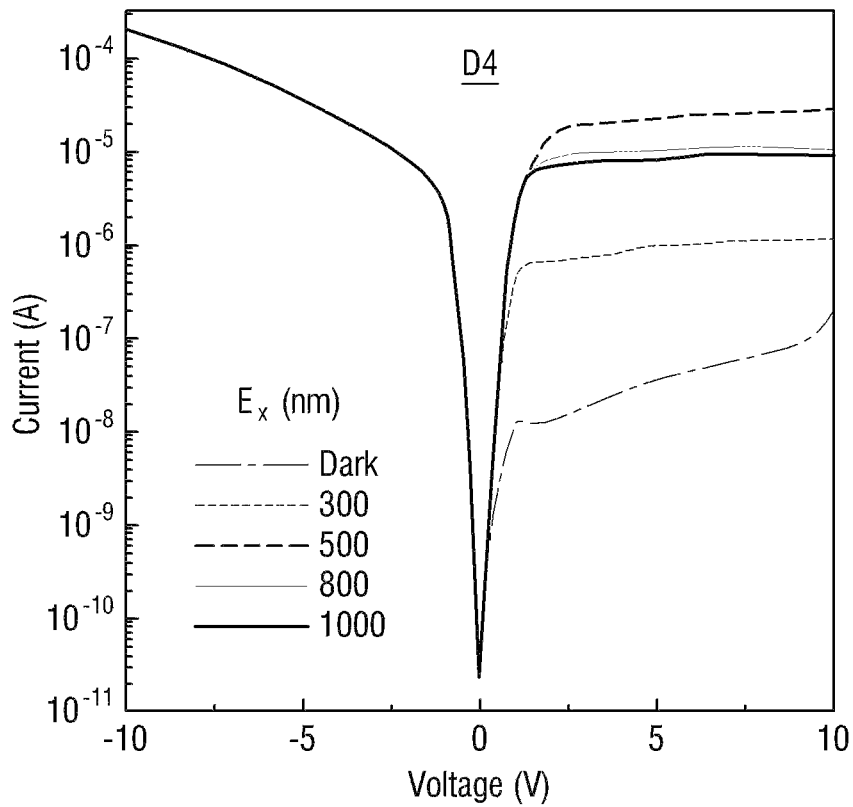
FIGS. 4 and 5 are graphs showing I-V curves under illumination in a photodetector according to an embodiment of the present invention.
Figure 5:
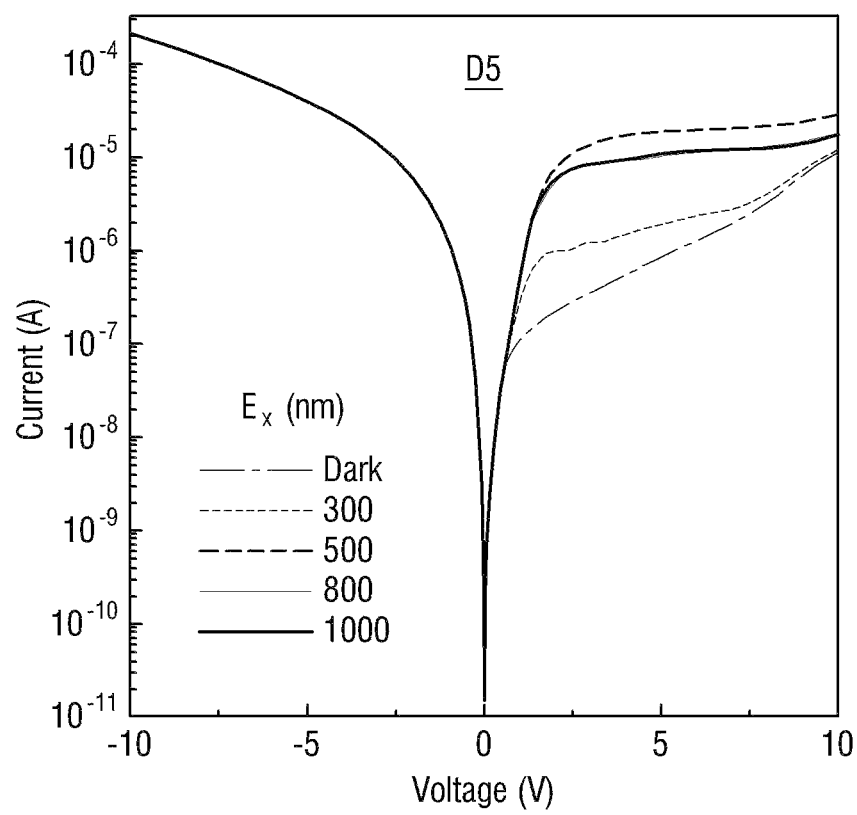
Figure 6:
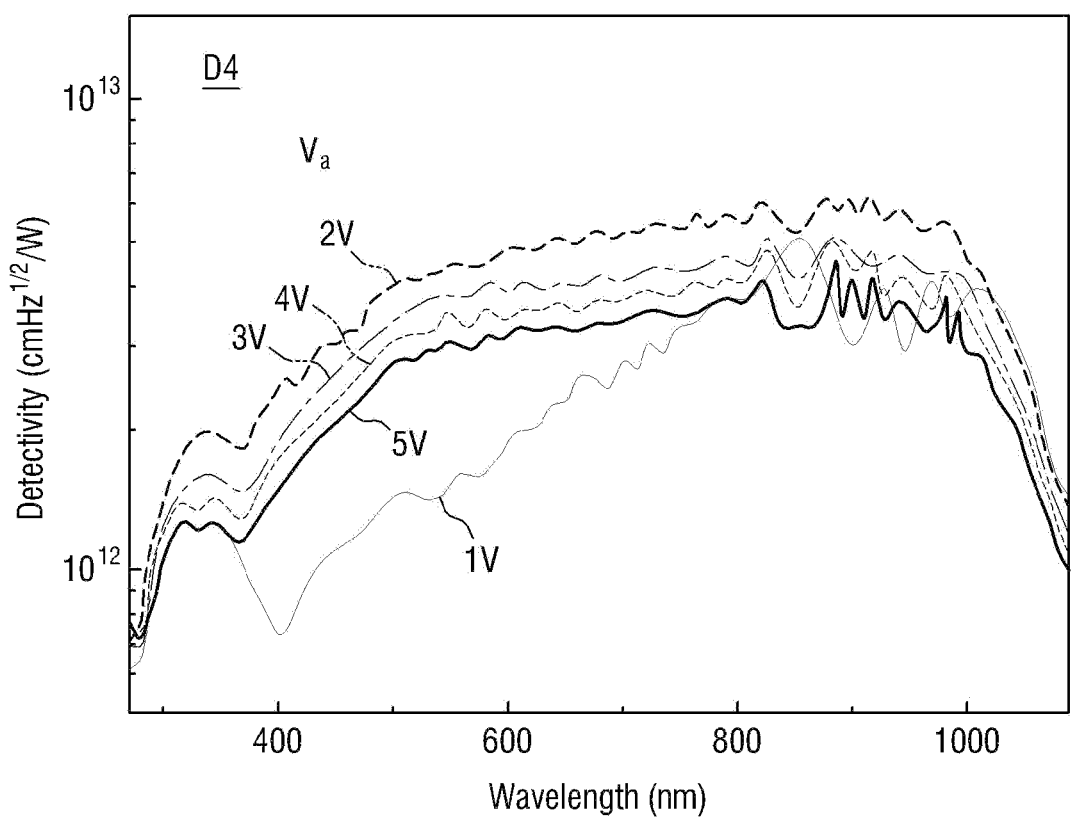
FIGS. 6 and 7 are graphs showing spectral detectivities in a photodetector according to an embodiment of the present invention.
Figure 7:
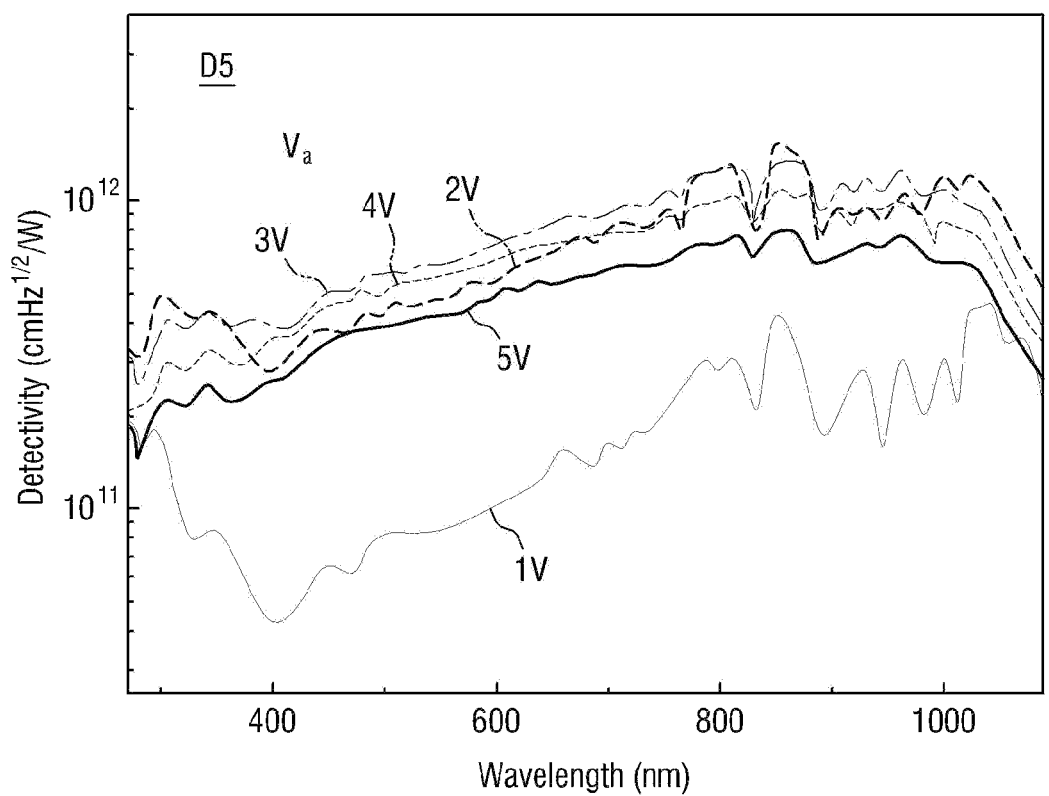
Figure 8:
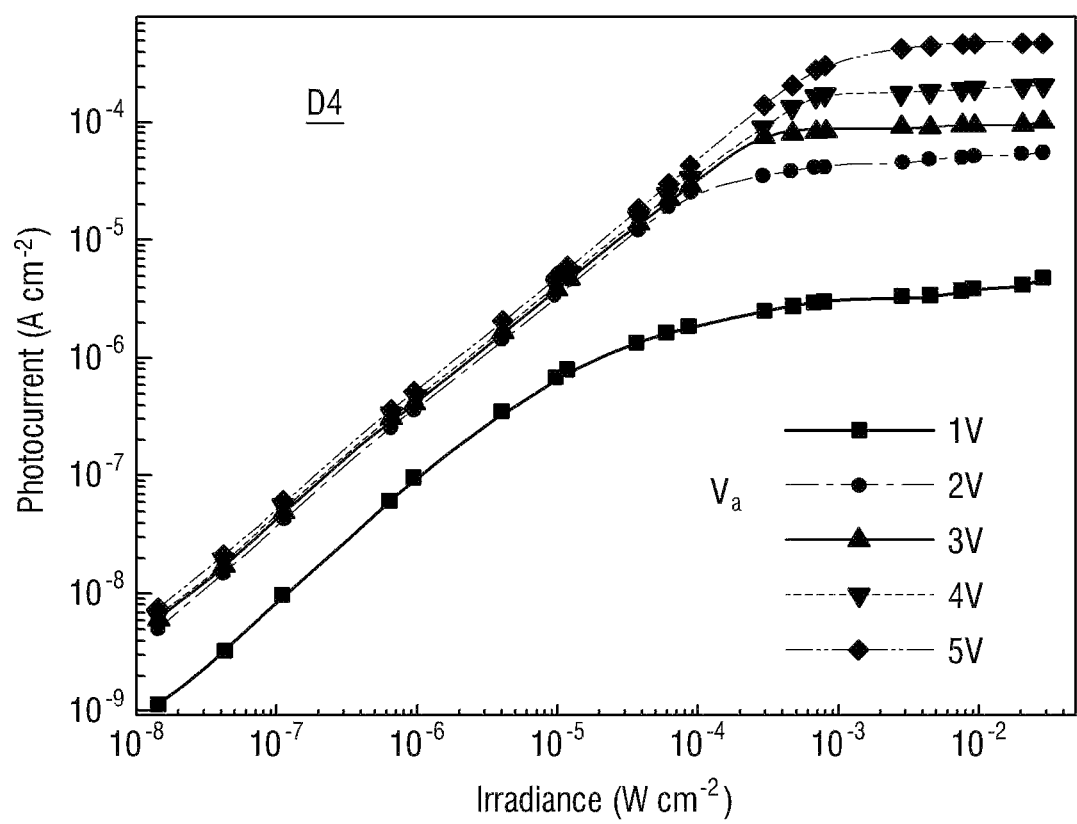
FIGS. 8 and 9 are graphs showing irradiance-dependent photocurrent densities in a photodetector according to an embodiment of the present invention.
Figure 9:
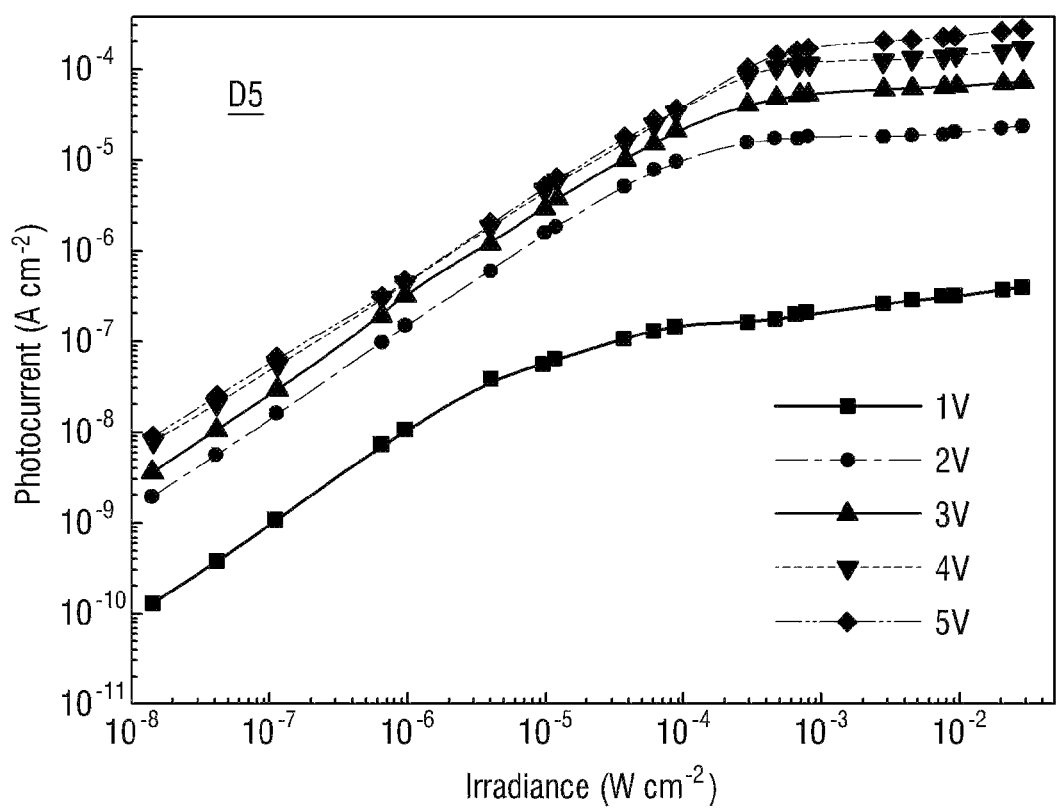
Figure 10:
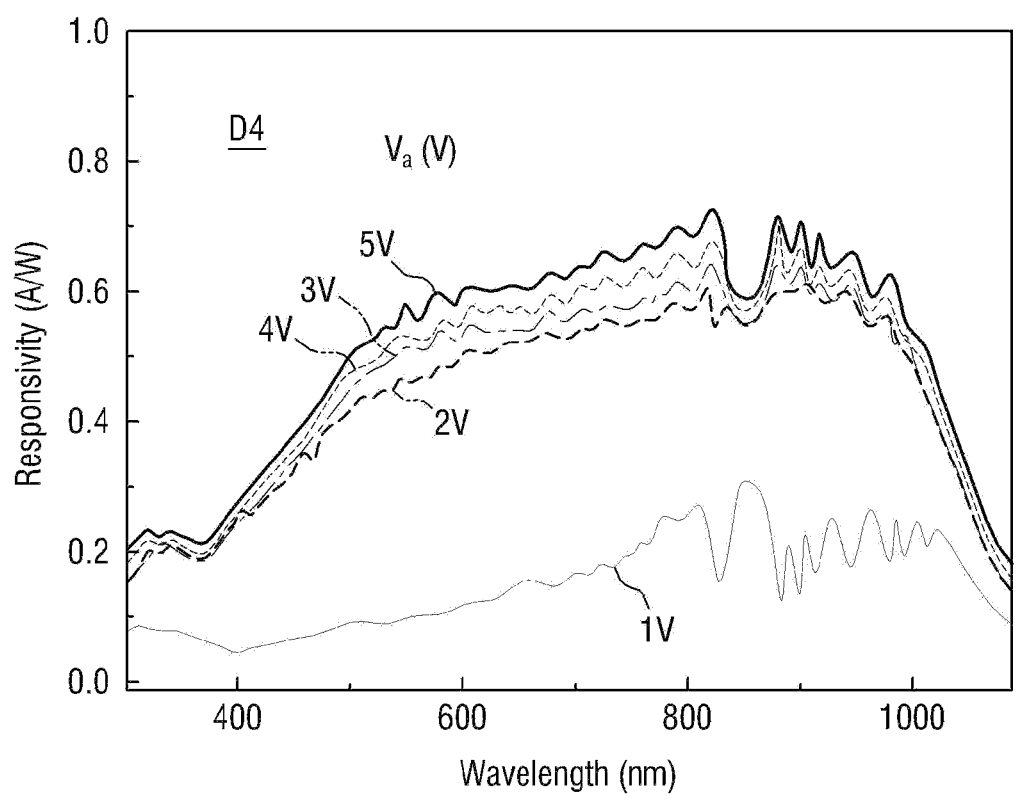
FIGS. 10 and 11 are graphs showing spectral responsivities in a photodetector according to an embodiment of the present invention.
Figure 11:
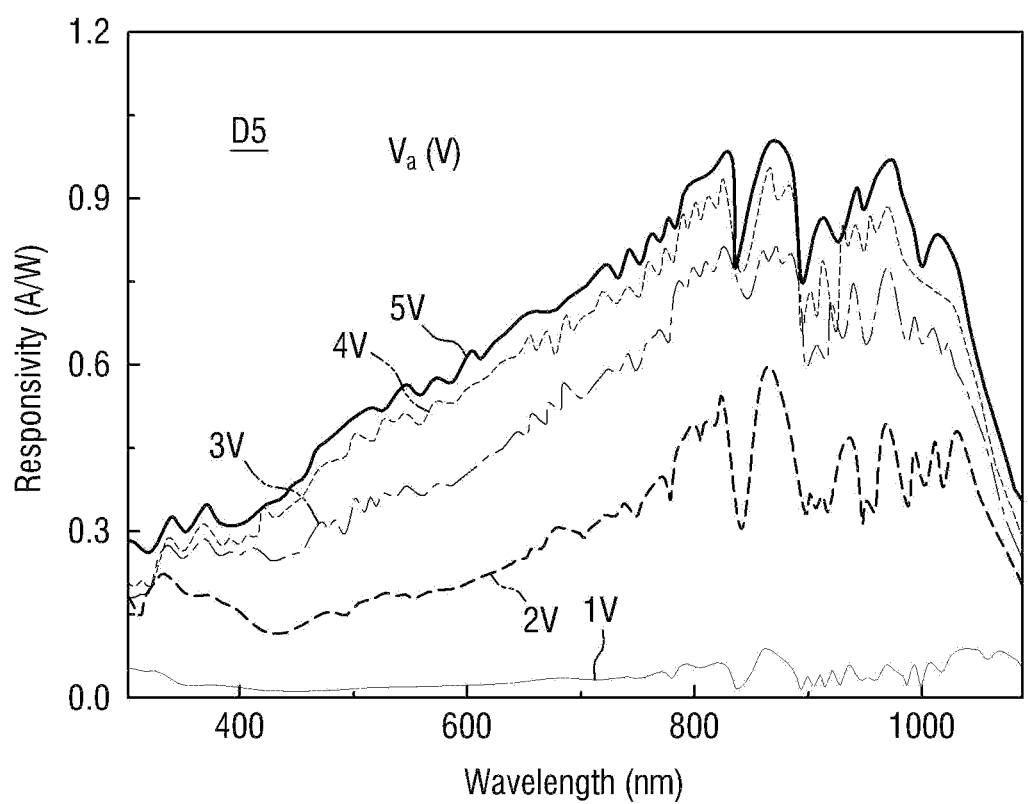
Figure 12:
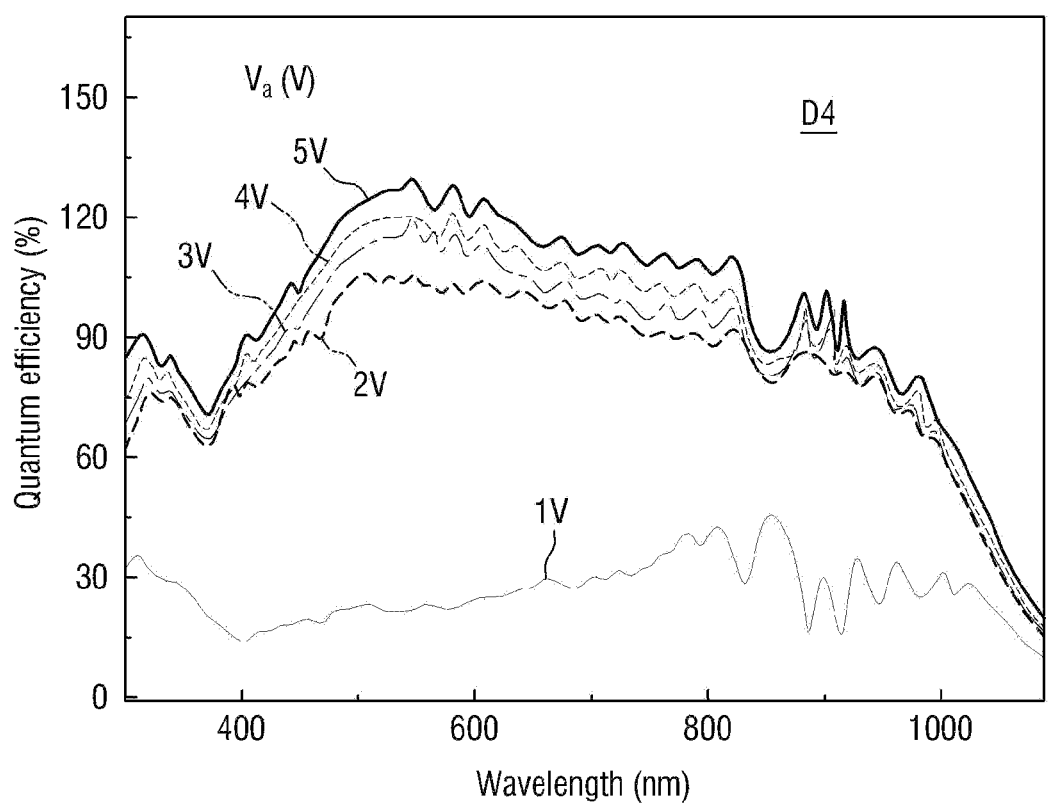
FIGS. 12 and 13 are graphs showing spectral quantum efficiencies in a photodetector according to an embodiment of the present invention.
Figure 13:
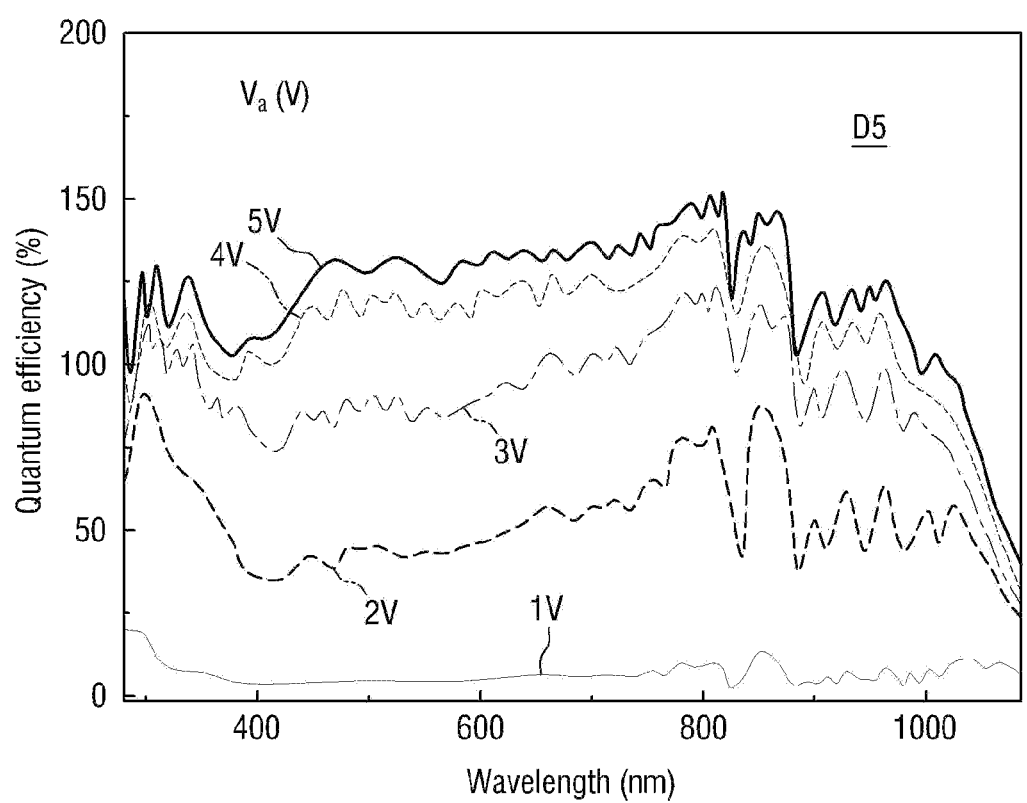

FIG. 3 is a log scale graph showing I-V characteristics of a photodetector according to an embodiment of the present invention. FIGS. 4 and 5 are graphs showing I-V curves under illumination in a photodetector according to an embodiment of the present invention. FIGS. 6 and 7 are graphs showing spectral detectivities in a photodetector according to an embodiment of the present invention. FIGS. 8 and 9 are graphs showing irradiance-dependent photocurrent density in a photodetector according to an embodiment of the present invention. FIGS. 10 and 11 are graphs showing spectral responsivities in a photodetector according to an embodiment of the present invention. FIGS. 12 and 13 are graphs showing spectral quantum efficiencies in a photodetector according to an embodiment of the present invention. FIGS. 14 through 17 are graphs showing time response of photocurrent in a photodetector according to an embodiment of the present invention. FIG. 18 shows time-dependent stabilities of responsivity in a photodetector according to an embodiment of the present invention.

Experimental results about electrical characteristics of the photodetector of the present invention will be described with reference to FIG. 3. FIG. 3 shows I-V characteristics of the photodetector by fixing a doping time of p-type second graphene in a photodetection layer to 5 minutes and by varying a doping time of n-type first graphene. In the photodetector according to an embodiment of the present invention, a doping concentration of the n-type first graphene was varied based on the doping time.

Experiment examples about the photodetector of the present invention are arranged as expressed by the following Table 1.

TABLE 1

|  | D0 | D1 | D2 | D3 | D4 | D5 |
|---|---|---|---|---|---|---|
| p-type second graphene | pristine | 5 min | 5 min | 5 min | 5 min | 5 min |
| n-type first graphene | pristine | 0.5 min | 1 min | 2 min | 3 min | 4 min |

In the case of experiment examples D0 through D3 in which an electron concentration is predicted to be low due to an absence of doping or a relatively short doping time, the photodetector shows no rectifying behaviors in current-voltage (I-V) curves before illumination toward the photodetector. It can be verified from an enlarged portion of FIG. 3 that the I-V curves are linear. That is, in experiment examples D0 through D3 in which an electron concentration of n-type graphene is low, the junctions of p-type graphene and n-type graphene show ohmic characteristics. When the electron concentration of the n-type first graphene is low, vertical junctions of the p-type second graphene and the n-type first graphene do not show rectifying behaviors due to the Klein-tunneling effect. Accordingly, the dark current of the photodetector is significantly high.

However, in the case of experiment examples D4 and D5, the dark current was greatly reduced over the full range of bias voltage compared to experiment examples D0 through D3. Also, I-V curves of experiment examples D4 and D5 show nonlinear properties. That is, experiment examples D4 and D5 in which the electron concentration of the n-type first graphene is high show rectifying behaviors. From experiment examples D4 and D5 in which the electron concentration of the n-type first graphene is high, it can be known that the vertical junctions of the n-type first graphene and the p-type second graphene became diodes. The diodes of experiment examples D4 and D5 may be operated as a high performance photodetector since the dark current was greatly reduced while the graphene p-n vertical junction diodes were formed.

That is, diode properties were verified in a photodetector including vertical junctions of n-type first graphene and p-type second graphene by increasing the doping time in the n-type first graphene when the doping time in the p-type second graphene is maintained to be constant. From this, it is possibly thought that a high resistive layer or an insulating layer was formed on the n-type first graphene of experiment examples D4 and D5 in which the doping time was increased. That is, it can be verified from the experiment examples that the n-type first graphene includes the high resistive layer formed at the interface between the first graphene and the second graphene.

Hereinafter, results about experiment examples D4 and D5 showing diode properties in I-V curves of FIG. 3 will be described with reference to FIGS. 4 through 17.

FIG. 4 is a graph showing a variation in a current as a function of applied voltage in experiment example D4, and FIG. 5 is a graph showing a variation in a current as a function of applied voltage in experiment example D5.

A xenon lamp was used as a light source to measure I-V characteristics for various wavelengths in the photodetector. Monochromatic light extracted by transmitting light generated from the xenon lamp to a monochromatic spectroscope was emitted toward the photodetector of experiment examples D4 and D5.

Referring to FIGS. 4 and 5, it can be verified that when the monochromatic light is illuminated toward the photodetector, the current is barely varied under reverse voltage and the current significantly increases under forward voltage.

In FIGS. 4 and 5, the current relates to a summation of a dark current and a photocurrent. It can be known that the photocurrent is not produced under reverse voltage by illuminating the monochromatic light, however, the photocurrent is not produced under forward voltage in response to the monochromatic light.

Further, FIG. 4 shows a low leakage current of about 0.01 μA by applying the forward voltage of 5V or more to the photodetector.

Comparing FIGS. 3 through 5, it can be verified that the dark current of experiment example D5 is higher than the dark current of experiment example D4.

FIG. 6 is a graph showing spectral detectivities in experiment example D4, and FIG. 7 is a graph showing spectral detectivities in experiment example D5.

Referring to FIG. 6, experiment example D4 shows the detectivity of $10^{12}$ Jones or more when a driving voltage of the photodetector is applied from 2V to 5V in the UV to IR ranges. In particular, the detectivity is maximized at 2V.

The above values of detectivity are similar to or beyond those found in Si and InGaAs photodetectors, which are commercialized in the market.

Referring to FIG. 7, experiment example D5 shows the detectivity that is relatively small compared to experiment example D4, however, is $10^{11}$ Jones or more when the applied voltage is from 2V to 5V in the UV to IR ranges.

As described above with reference to FIGS. 4 and 5, the detectivity of experiment example D5 is lower than the detectivity of experiment example D4 since the dark current of experiment example D5 is higher than the dark current of experiment example D4.

Hereinafter, the excellence of the detectivity of the photodetector proposed herein will be described. That is, in the case of the commercialized Si photodetector or InGaAs detector, a wavelength range for detecting the light was specialized. However, the photodetector of the present invention shows the detectivity of $10^{11}$ Jones or more in the range of 350 nm to 1100 nm. Further, the photodetector of the present invention shows the detectivity of $10^{11}$ Jones or more at room temperature without using a separate cooling device.

FIG. 8 is a graph showing irradiance-dependent linearity of photocurrent density in experiment example D4, and FIG. 9 is a graph showing irradiance-dependent linearity of photocurrent density in experiment example D5.

Referring to FIGS. 8 and 9, a linear dynamic range (LDR) that is one of performance indices of the photodetector may be calculated. To this end, a variation in a photocurrent was measured while varying laser intensity of 532 nm.

Referring to FIGS. 8 and 9, it can be verified that the photocurrent of the photodetector has increased from $10^{-8}$ (A/cm$^2$) to $10^{-4}$ (A/cm$^2$) with increasing the irradiance of light illuminated toward a photodetection layer of the photodetector from $10^{-8}$ (W/cm$^2$) to $10^{-4}$ (W/cm$^2$) when the applied voltage is between 2V and 5V.

That is, it can be verified that when the irradiance of the light varies in the range from $10^{-8}$ (W/cm$^2$) to $10^{-4}$ (W/cm$^2$), the photocurrent varies with the gradient of almost '1'. When the gradient of the variation in the photocurrent depending on the irradiance of the light is close to '1', the photodetector may become close to an ideal photodetector.

FIG. 10 is a graph showing spectral responsivities in experiment example D4, and FIG. 11 is a graph showing spectral responsivities in experiment example D5. Also, numbers indicated on the graphs of FIGS. 10 and 11 denote voltages applied to the photodetector.

Referring to FIG. 10, the responsivity significantly increases according to an increase in the applied voltage from 1V to 2V. According to an increase in the wavelength of light from 400 nm to 600 nm, the responsivity significantly increases from about 0.3 A/W to about 0.6 A/W and then slowly increases. The responsivity shows a maximum value, about 0.7 A/W, in 900 nm.

That is, similar to the detectivity described above with reference to FIG. 6, even in the responsivity, experiment example D4 has photosensitivity in the range of 350 nm to 1100 nm, that is, a relatively wide region ranging from UV to IR.

Referring to FIG. 11, the responsivity does not significantly increase with increasing the applied voltage from 1V to 2V since the dark current of experiment example D5 is relatively high compared to the dark current of experiment example D4, which is described above with reference to FIG. 3.

It can be verified that the responsivity increases with increasing the wavelength of light from 300 nm to 800 nm. In particular, the responsivity shows a maximum of 0.4 A/W in the range of wavelength from 300 nm to 400 nm and shows a maximum of 1.0 A/W in the range of wavelength from 700 nm to 1000 nm. Experiment example D5 shows a relatively high responsivity compared to experiment example D4. That is, compared to experiment example D4, experiment example D5 may be applicable to a photodetector that requires a relatively high photo responsivity.

Also, similar to the detectivity described above with reference to FIG. 7, even in the responsivity, experiment example D5 has the photosensitivity in the range of 350 nm to 1100 nm, that is, a relatively wide region ranging from UV to IR.

FIG. 12 is a graph showing spectral quantum efficiencies in experiment example D4, and FIG. 13 is a graph showing spectral quantum efficiencies in experiment example D5.

Referring to FIGS. 12 and 13, in photodetectors according to experiment examples D4 and D5, the quantum efficiency increases with increasing the applied voltage. When the applied voltage is 4V or more, the two photodetectors show the quantum efficiency over 100%, due to a carrier multiplication phenomenon that a single photon is incident to a photodetection layer of the photodetector, thereby producing multiple numbers of electrons and holes. The carrier multiplication phenomenon results from a multiplication ionization process of electrons and holes.

Figure 14:
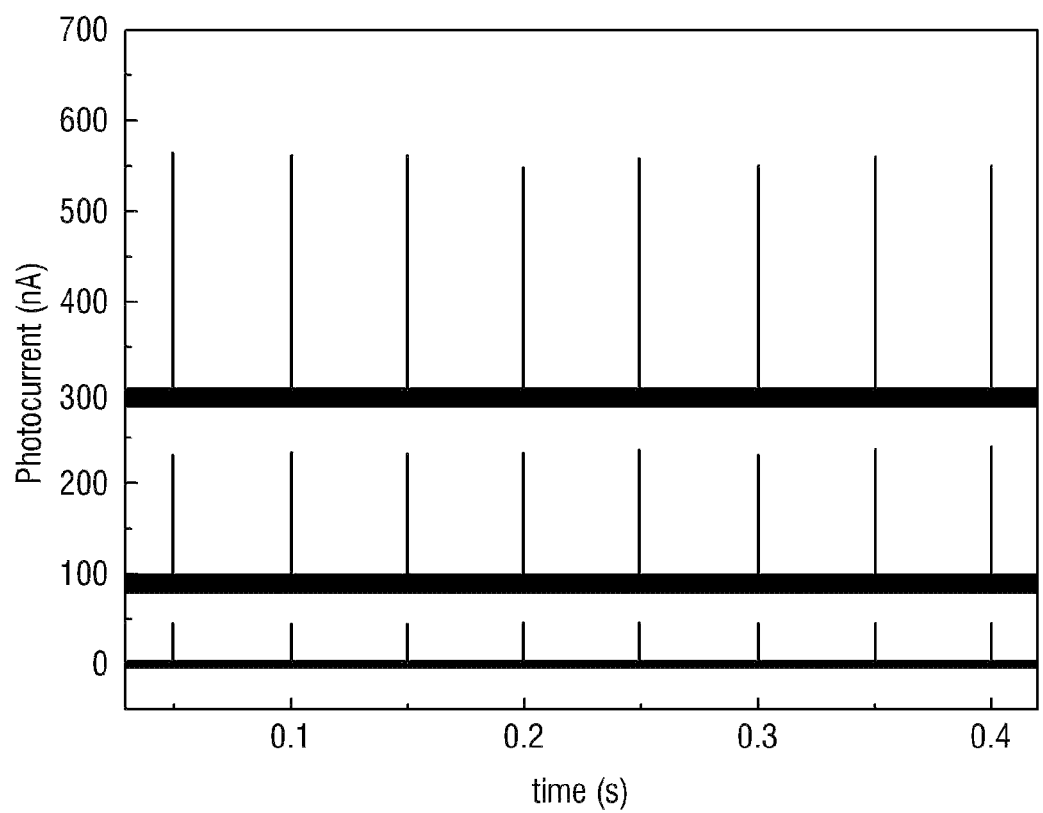
FIGS. 14 through 17 are graphs showing time response of photocurrent in a photodetector according to an embodiment of the present invention.
Figure 15:
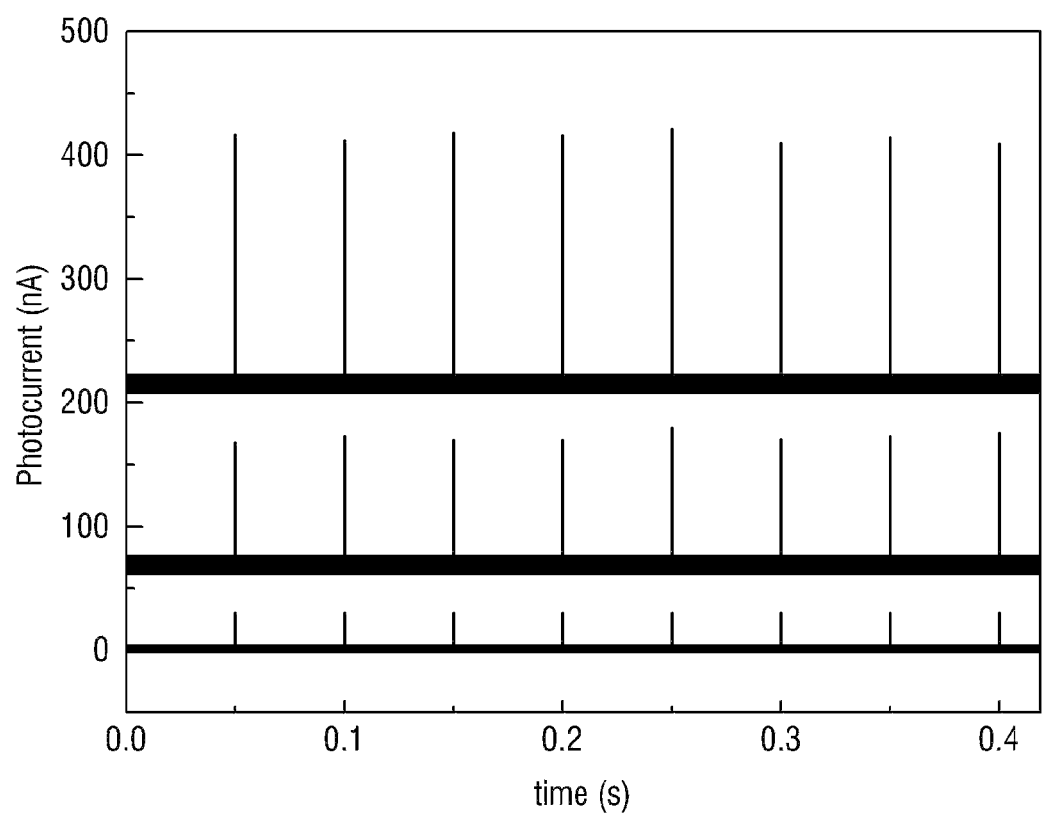
Figure 16:
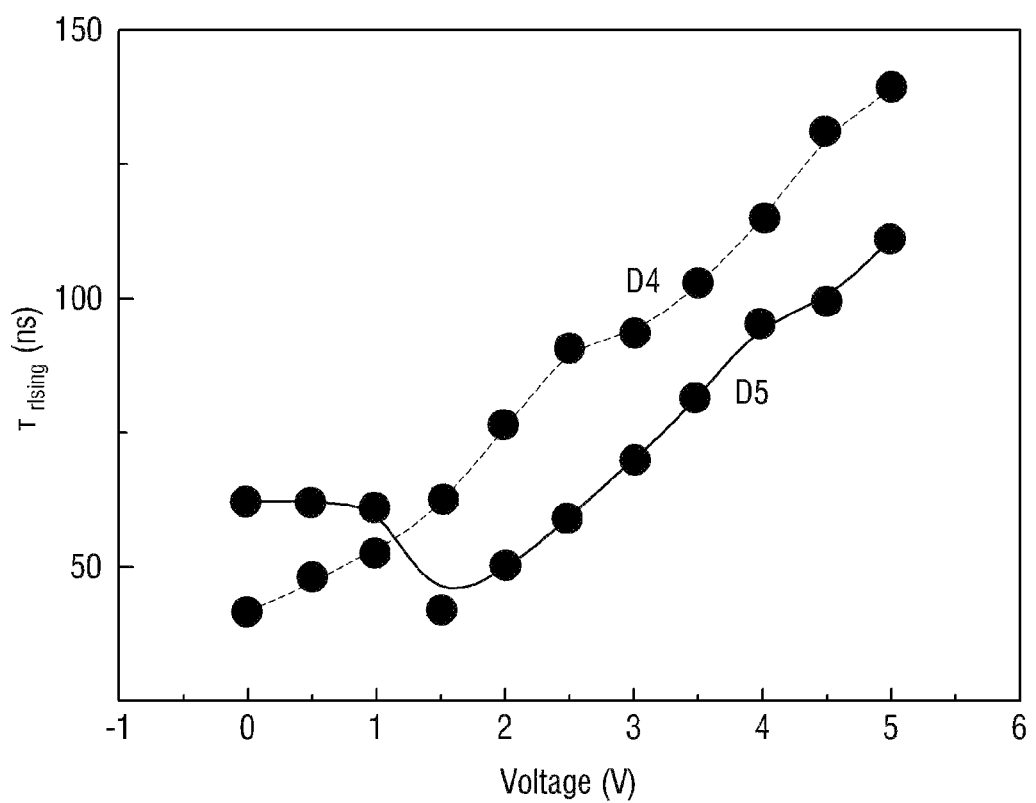
Figure 17:
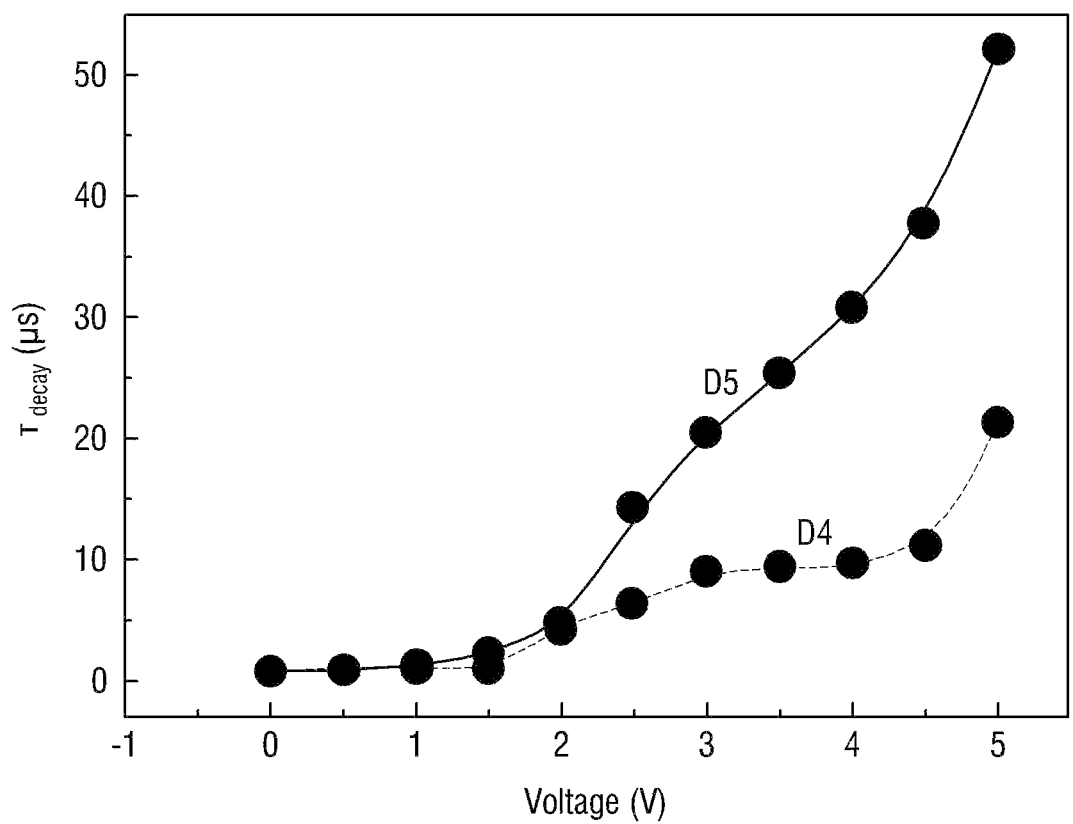
Figure 18:
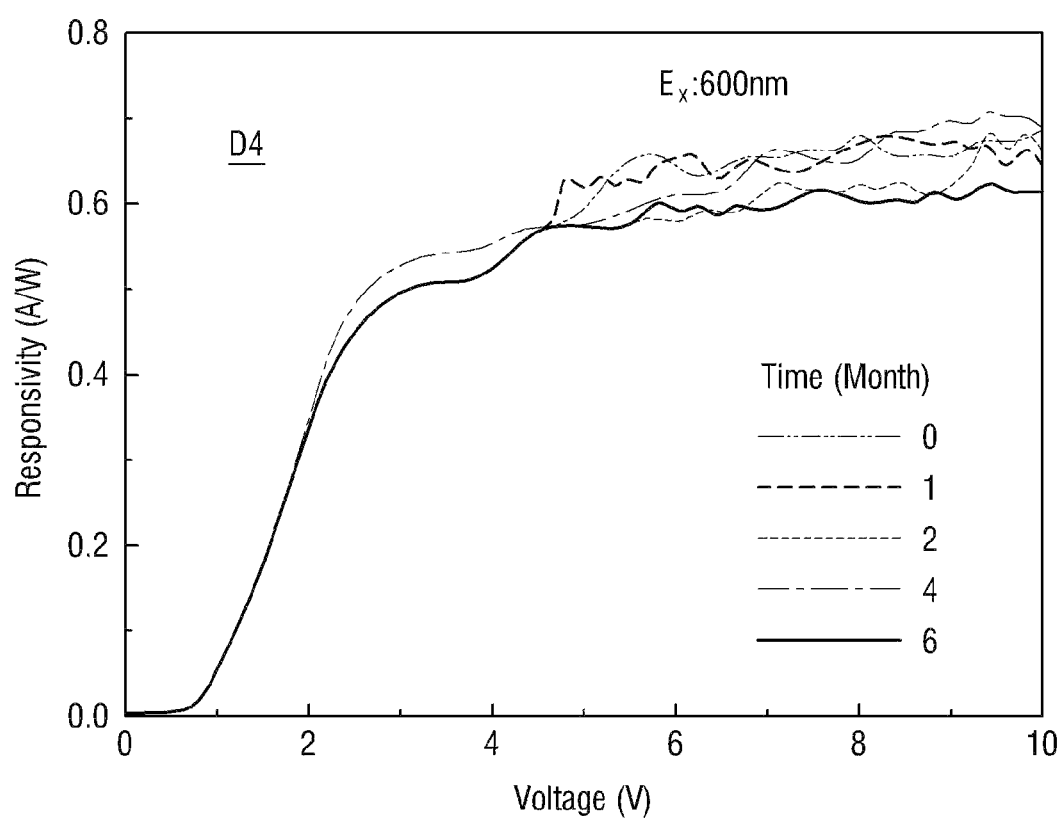
FIG. 18 is a graph showing time-dependent stabilities of responsivity in a photodetector according to an embodiment of the present invention.

FIGS. 14 through 17 show time response of photocurrent when light pulse is applied to the photodetector. In FIGS. 14 and 15, the response rate was measured by using a 532 nm pulse laser having 20 ps and 20 Hz as a light source. FIG. 16 is a graph showing a rising time during which a photocurrent of the photodetector increases in reaction to the incident light, and FIG. 17 is a graph showing a decay time after which the photocurrent disappears.

Charge transport dynamics of the photodetector may be studied by measuring time response of the photocurrent when a single laser pulse is illuminated. A response time to the light may be divided into a rising time and a decay time.

Referring to FIGS. 14 and 15, the photodetectors corresponding to experiment examples D4 and D5 are periodically operated even by the repeated switching of the light pulse irrespective of the applied voltage. That is, every time a pulse is applied, the photocurrent is regularly produced and the magnitude of the photocurrent is almost same.

Referring to FIGS. 16 and 17, the decay time $\tau_{decay}$ is relatively short compared to the rising time $\tau_{rising}$. That is, the photo reaction time of the photodetector is determined based on the decay time of the photodetector. Overall, the response rate of the photodetector corresponding to experiment example D4 is faster than the response rate of the photodetector corresponding to experiment example D5.

According to an increase from 1.5V to 5V, the rising time of the photodetector corresponding to experiment example D4 gradually increases from 62 ns to 139 ns. The decay time of the photodetector increases from 0.9 μs to 21 μs with increasing the applied voltage. That is, the photo reaction time of the photodetector is determined based on the decay time of the photodetector and the photodetector is operated within tens of micro seconds.

With increasing applied voltage from 1.5V to 5V, the rising time of the photodetector corresponding to experiment example D5 gradually increases from 41 ns to 110 ns. The decay time of the photodetector increases from 2 μs to 52 μs with increasing applied voltage.

FIG. 18 shows the stability of the photodetector by measuring the responsivity as a function of time in experiment example D4. FIG. 18 is a graph showing a case at a wavelength of 600 nm.

Referring to FIG. 18, while the photodetector corresponding to experiment example D4 was exposed to the air for 6 months, the photo responsivity of the photodetector was not varied. That is, the photodetector using graphene of p-n vertical junctions as the photodetection layer shows a considerably stable property in the air.

Although a few exemplary embodiments of the present invention have been shown and described, the present invention is not limited to the described exemplary embodiments. Instead, it would be appreciated by those skilled in the art that changes may be made to these exemplary embodiments without departing from the principles and spirit of the invention, the scope of which is defined by the claims and their equivalents.

What is claimed is:

1. A photodetector comprising:
   a substrate;
   a photodetection layer formed on the substrate, the photodetection layer comprising a vertical tunneling-junction of p-type graphene and n-type graphene, and having a detectivity of 10E11 Jones (cmHz$^{1/2}$/W) or more within a wavelength range of light from 350 nm to 1100 nm; and
   a first electrode and a second electrode formed on the photodetection layer.

2. The photodetector of claim 1, wherein the photodetector comprises first graphene and second graphene that are sequentially stacked on the substrate, and
   the first graphene is n-type graphene, and the second graphene is p-type graphene.

3. The photodetector of claim 2, wherein each of the first graphene and the second graphene is monolayer graphene.

4. The photodetector of claim 2, wherein the first graphene and the second graphene are formed through contact therebetween.

5. The photodetector of claim 4, wherein the first graphene comprises a high resistive layer formed at the interface between the first graphene and the second graphene.

6. The photodetector of claim 2, wherein the photodetection layer further comprises an inserting layer formed between the first graphene and the second graphene.

7. The photodetector of claim 6, wherein the inserting layer comprises one of a semiconductor layer and an insulating layer.

8. The photodetector of claim 1, wherein the photodetection layer has the detectivity of 10E11 Jones (cmHz$^{1/2}$/W) or more within the wavelength range of light from 350 nm to 1100 nm when a voltage applied to the first electrode and the second electrode is between 2 V to 5 V.

* * * * *